(12) United States Patent
McCarten et al.

(10) Patent No.: US 7,858,915 B2
(45) Date of Patent: Dec. 28, 2010

(54) ACTIVE PIXEL SENSOR HAVING TWO WAFERS

(75) Inventors: John P. McCarten, Penfield, NY (US);
Joseph R. Summa, Hilton, NY (US);
Robert M. Guidash, Rochester, NY (US); Todd J. Anderson, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 398 days.

(21) Appl. No.: 12/058,845

(22) Filed: Mar. 31, 2008

(65) Prior Publication Data
US 2009/0242950 A1 Oct. 1, 2009

(51) Int. Cl.
*H01L 27/146* (2006.01)
(52) U.S. Cl. .................... 250/208.1; 257/292
(58) Field of Classification Search ......... 250/226, 250/216, 208.1; 257/292, 290, 350, 192, 257/351, 444, 445, 446, 461, 466; 348/302, 348/308
See application file for complete search history.

(56) References Cited

U.S. PATENT DOCUMENTS

| | | |
|---|---|---|
| 6,380,572 B1 | 4/2002 | Pain et al. |
| 6,927,432 B2 | 8/2005 | Holm et al. |
| 7,160,753 B2 | 1/2007 | Williams, Jr. |
| 2006/0146233 A1 | 7/2006 | Park |
| 2007/0018075 A1 | 1/2007 | Cazaux et al. |
| 2007/0069258 A1 | 3/2007 | Ahn |
| 2008/0083939 A1 | 4/2008 | Guidash |
| 2008/0251823 A1* | 10/2008 | Lee .............................. 257/292 |

FOREIGN PATENT DOCUMENTS

| | | |
|---|---|---|
| EP | 0757476 | 2/1997 |
| EP | 1453097 | 9/2004 |
| EP | 1 833 112 | 1/2008 |
| JP | 2001339057 | 12/2001 |
| JP | 2005353994 | 12/2005 |

OTHER PUBLICATIONS

"Intelligent Image Sensor Chip with Three Dimensional Structure" by H. Kurino et al., Dept. of Machine Intelligence and Systems Engineering, Tohoku University, pp. 36.4.1-36.4.4, Sep. 1999.
"Building Hybrid Active Pixels for CMOS Imager on SOI Substrate" by Weiquan Zhang, et al., IEEE International SOI Conference, Oct. 1999, pp. 102-103.
"Megapixel CMOS Image Sensor Fabricated in Three-Dimensional Integrated Circuit Technology", by Vyshnavi Suntharalingam, et al., 2005 IEEE International Solid-State Circuits Conference, pp. 356-357.

* cited by examiner

*Primary Examiner*—Tony Ko
(74) *Attorney, Agent, or Firm*—Nancy R. Simon

(57) ABSTRACT

A vertically-integrated image sensor includes a sensor wafer connected to a support circuit wafer. Each pixel region on the sensor wafer includes a photodetector, a charge-to-voltage conversion mechanism, a transfer mechanism for transferring charge from the photodetector to the charge-to-voltage conversion mechanism, and a reset mechanism for discharging the charge-to-voltage conversion mechanism. The support circuit wafer includes an amplifier and other support circuitry for each pixel region on the sensor wafer. An inter-wafer connector directly connects each charge-to-voltage mechanism on the sensor wafer to a respective gate to an amplifier on the support circuit wafer.

10 Claims, 3 Drawing Sheets

US 7,858,915 B2

ACTIVE PIXEL SENSOR HAVING TWO WAFERS

TECHNICAL FIELD

The invention relates generally to the field of active pixel sensors, and more particularly to active pixel sensors having two separate semiconductor wafers with each wafer including a portion of the electrical circuitry.

BACKGROUND

CMOS Image sensors (CIS) suffer from the issue that deeply scaled sub-micron Complementary Metal Oxide Semiconductor (CMOS) processes are required to realize small pixels that can compete with charge-coupled device (CCD) pixel sizes. In general, as the CMOS processes scale to smaller dimensions, the details of the process integration and structure change, and the pixel performance degrades. Two examples of this are shallow trench isolation and heavily doped retrograde wells. Both are necessary to build deep sub-micron CMOS devices, but both have adverse effects on dark current for pixels. As a result, much work has to be done to re-integrate and re-optimize the photodetector and pixel into each new deep sub-micron CMOS technology node.

Designers, however, face a trade-off with respect to the design and manufacture of sub-micron CMOS devices. Designers can either maintain pixel image quality by not moving to more scaled CMOS processes, which results in a lower fill factor for smaller pixels, or move to a smaller design rule process to achieve small pixels, which results in a need to re-integrate and re-engineer the photodetector to obtain acceptable image quality.

One solution to these issues is to build the photodetector separately from the CMOS circuits. The image sensor, for example, can be built on different wafers, and the wafers joined together using three-dimensional integration or wafer level interconnect technologies. U.S. Pat. No. 6,927,432 fabricates an active pixel sensor using two semiconductor wafers. One wafer, the donor wafer, includes the photodetectors while another wafer, the host wafer, includes an interconnect layer and electrical circuits for in-pixel signal operations and read out of the photodetectors. Pixel interconnects directly connect each photodetector on the donor wafer to a respective node or circuit on the host wafer.

Although this approach separates the processing of the photodetector and circuits, it degrades photodetector performance due to the direct contact or connection with the photodetector. Specific examples of such performance degradation include, but are not limited to, increased dark current due to damage from the contact etch process, increased metallic contamination in the photodetector leading to point defects, and high dark current due to being connected to a highly doped ohmic contact region.

FIG. 1 is a schematic diagram of another pixel architecture that can be implemented on two semiconductor wafers in accordance with the prior art.

This pixel architecture is disclosed in commonly assigned U.S. patent application Ser. No. 11/867,199 filed on Oct. 4, 2007. Pixel 100 includes photodetector 102, transfer gate 104, charge-to-voltage conversion mechanism 106(SW), 106 (CW), reset transistor 108, potential $V_{DD}$ 110, source follower amplifier transistor 112, and row select transistor 114. The drain of row select transistor 114 is connected to the source of source follower 112 and the source of row select transistor 114 is connected to output $V_{out}$ 116. The drains of reset gate 108 and source follower 112 are maintained at potential $V_{DD}$ 110. The source of reset gate 108 and the gate of source follower 112 are connected to charge-to-voltage conversion mechanism 106(CW).

Dashed lines 118 surround photodetector 102, transfer gate 104, and charge-to-voltage conversion mechanism 106(SW) to delineate the components included on one wafer, a sensor wafer. Charge-to-voltage conversion mechanism 106(CW), reset gate transistor 108, potential $V_{DD}$ 110, source follower amplifier transistor 112, row select transistor 114, output 116, which are not surrounded by dashed lines 118, represent the components formed on a second wafer, a circuit wafer. Inter-wafer connection 120 electrically connects charge-to-voltage conversion mechanism 106(SW) on the sensor wafer to charge-to-voltage conversion mechanism 106(CW) on the circuit wafer.

Image sensors having pixels with the architecture shown in FIG. 1 require a charge-to-voltage conversion mechanism on each wafer. This requirement increases the cost to manufacture such image sensors because both the sensor wafer and the circuit wafer must be processed as cleanly as possible. Additionally, the use of inter-wafer connection 120 as a common node for charge-to-voltage conversion mechanism 106(SW), 106(CW), reset transistor 108, and source follower amplifier transistor 112 increases the capacitance in the connection.

SUMMARY

An image sensor includes two semiconductor wafers, a sensor wafer connected to a support circuit wafer. The sensor wafer includes an array of pixel regions with each pixel region including a photodetector, a transfer mechanism, a charge-to-voltage conversion mechanism, and a reset mechanism. The support circuit wafer includes an interconnect layer and a CMOS device layer. The CMOS device layer includes support circuitry for one or more pixel regions. The types of components and circuits used in the CMOS device layer depend on the purpose or use of the image sensor. The support circuitry can be included in corresponding pixel regions on the support circuit wafer with each region on the support circuit wafer being used by a single respective pixel region on the sensor wafer.

Alternatively, two or more pixel regions on the sensor wafer can share some or all of the support circuitry on the support wafer. Inter-wafer connectors directly connect each charge-to-voltage conversion mechanism on the sensor wafer to a respective gate to an amplifier on the support circuit wafer.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention includes the advantages of having both high image quality and high fill factor. The sensor wafer can be used with multiple support circuit wafer designs or technologies, thereby providing improved design flexibility and optimization along with reduced costs. The connection between the sensor wafer and the support circuit wafer can be achieved through a direct connection between each charge-to-voltage conversion mechanism on the sensor wafer and a respective gate to an amplifier on the support circuit wafer, thereby reducing capacitance and bright point defects. Bright point defects from the circuit wafer are eliminated because of the gate only connection. Those skilled in the art will recognize that dislocations and other defects are more difficult to control and eliminate as transistor size is scaled to smaller dimensions. Therefore, not making a direction connection to the circuit wafer eliminates bright point defects from the reset connection on the circuit wafer for current designs, and allows designers to more easily scale the transistors on the circuit wafer without increasing the number of pixel defects on the sensor wafer.

DETAILED DESCRIPTION

In the following Detailed Description, reference is made to the accompanying drawings, which form a part hereof, and in which is shown by way of illustration an exemplary embodiment in which the invention may be practiced.

In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected, or an indirect connection through one or more passive or active intermediary devices. The term "circuit" means either a single component or a multiplicity of components, either active or passive, that are connected together to provide a desired function. The term "signal" means at least one current, voltage, or data signal.

Figure 1:
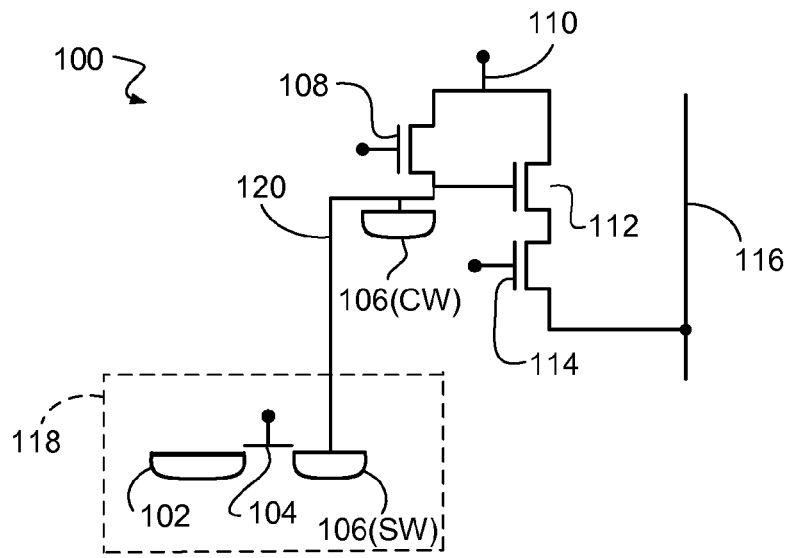
FIG. 1 is a schematic diagram of a pixel architecture implemented on two semiconductor wafers in accordance with the prior art.
Figure 2:
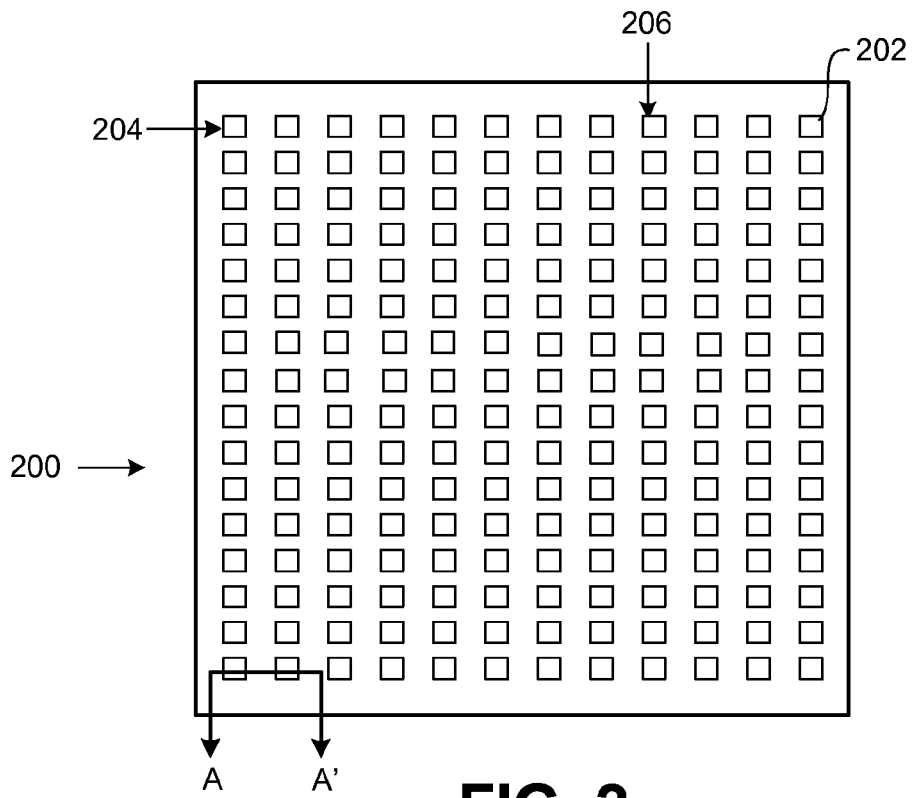
FIG. 2 is a top view of an image sensor having two semiconductor wafers in an embodiment in accordance with the invention.

Referring now to FIG. 2, there is shown a top view of an image sensor having two semiconductor wafers in an embodiment in accordance with the invention. Image sensor 200 includes pixel regions 202 arranged in rows 204 and columns 206 to form an array. The array can have any number of pixels regions, such as, for example, 1280 columns by 960 rows of pixel regions. Image sensor 200 is implemented an active pixel sensor, such as, for example, a Complementary Metal Oxide Semiconductor (CMOS) image sensor in the embodiment shown in FIG. 2. An active pixel sensor has pixels that each includes one or more active electrical components, such as transistors, within the pixel cell.

Figure 3:
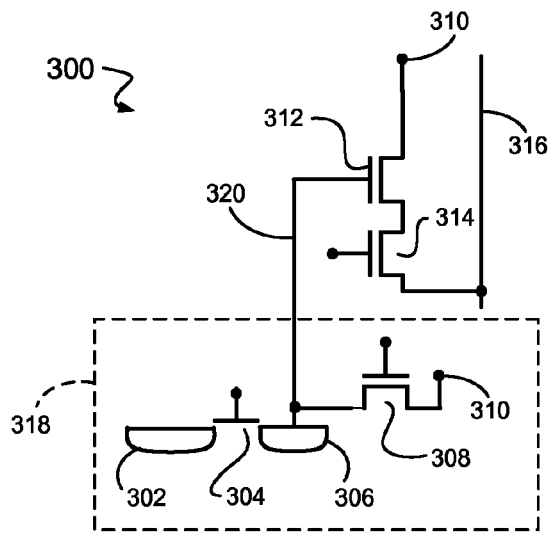
FIG. 3 is a schematic diagram of a pixel architecture that can be implemented in the image sensor 200 shown in FIG. 2 in an embodiment in accordance with the invention.

FIG. 3 is a schematic diagram of a pixel architecture that can be implemented in the image sensor 200 shown in FIG. 2 in an embodiment in accordance with the invention. Pixel 300 includes photodetector 302, transfer mechanism 304, charge-to-voltage conversion mechanism 306, reset mechanism 308, supply voltage $V_{DD}$ 310, amplifier 312, and row select transistor 314.

Transfer mechanism 304 and reset mechanism 308 are implemented as transistors, amplifier 312 as a source follower transistor, and charge-to-voltage conversion mechanism 306 as a floating diffusion in an embodiment in accordance with the invention.

In the embodiment shown in FIG. 3, the drain of row select transistor 314 is connected to the source of source follower transistor 312 and the source of row select transistor 314 is connected to output 316. The drains of reset transistor 308 and source follower transistor 312 are maintained at supply voltage $V_{DD}$ 310. The source of reset transistor 308 and the gate of source follower transistor 312 are connected directly to charge-to-voltage conversion mechanism 306.

Dashed lines 318 surround photodetector 302, transfer mechanism 304, charge-to-voltage conversion mechanism 306, and reset mechanism 308 to delineate the components included on a sensor wafer. Amplifier 312, row select transistor 314, and output 316, which are not surrounded by dashed lines 318, represent the components formed on a support circuit wafer in an embodiment in accordance with the invention. Inter-wafer connector 320 directly connects charge-to-voltage conversion mechanism 306 on the sensor wafer to the gate of source follower transistor 312 on the support circuit wafer.

Figure 4:
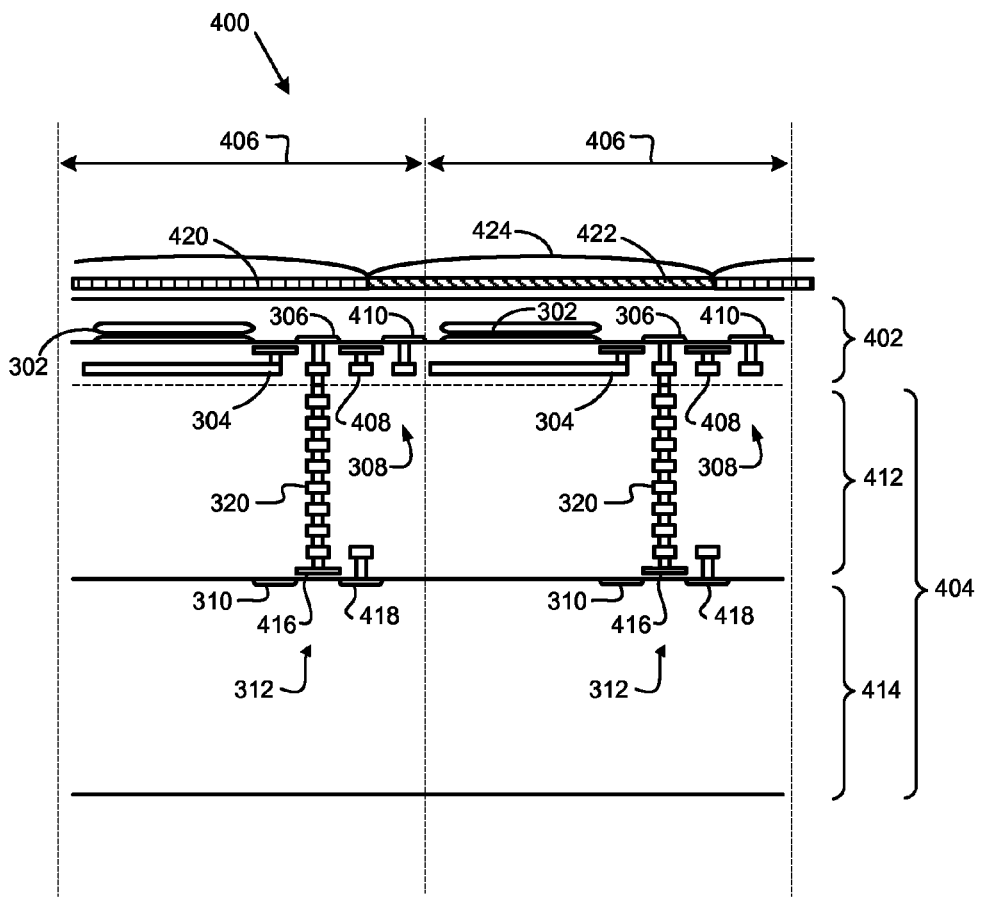
FIG. 4 is a cross-sectional view along line A-A' in FIG. 2 illustrating the pixel architecture of FIG. 3 in an embodiment in accordance with the invention.

Referring now to FIG. 4, there is shown a cross-sectional view along line A-A' in FIG. 2 illustrating the pixel architecture of FIG. 3 in an embodiment in accordance with the invention. Image sensor 400 includes sensor wafer 402 and support circuit wafer 404. Sensor wafer 402 includes pixel regions 406 with each pixel region 406 including photodetector 302, transfer mechanism 304, charge-to-voltage conversion mechanism 306, and reset mechanism 308. Each reset mechanism 308 includes reset gate 408 and reset drain 410 in an embodiment in accordance with the invention.

Support circuit wafer 404 includes interconnect layer 412 and CMOS device layer 414 in an embodiment in accordance with the invention. Interconnect layer 412 is formed with a dielectric material and includes inter-wafer connectors 320 that are each formed from a combination of metal layers in an embodiment in accordance with the invention. Inter-wafer connectors 320 directly connect each charge-to-voltage conversion mechanism 306 on sensor wafer 402 to gate 416 of source follower transistor 312 on support circuit wafer 404.

CMOS device layer 414 includes support circuitry for pixel regions 406. The support circuitry can be dedicated to each pixel region 406 or some or all of the support circuitry can be shared by two or more pixel regions 406. The types of components and circuits used in CMOS device layer 414 depend on the purpose or use of image sensor 400. By way of example only, CMOS device layer 414 includes a source follower transistor 312, a row select transistor (not shown), and a supply voltage $V_{DD}$ 310 for each pixel region 406 in an embodiment in accordance with the invention. Each source follower transistor 312 includes gate 416 and drain 418. CMOS device layer 414 includes additional or different analog and digital circuits in other embodiments in accordance with the invention. Examples of such analog and digital circuits include, but are not limited to, row and column decoders and drivers, per column sample and hold circuits, analog signal processing chains, digital image processing blocks, memory, timing and control circuits, input/output (I/O), and bond pads.

Color filters 420, 422 are formed over sensor wafer 402 and are used to filter the bandwidth of incident light received by each photodetector 302. By way of example only, color filter 420 is configured such that light propagating at or near the red spectrum is received by its underlying photodetector 302 while color filter 422 is configured so that light propagating at or near the green spectrum is received by its underlying photodetector 302. Microlenses 424 are formed over color filters 420, 422 and are used to direct light towards photodetectors 302.

Figure 5:
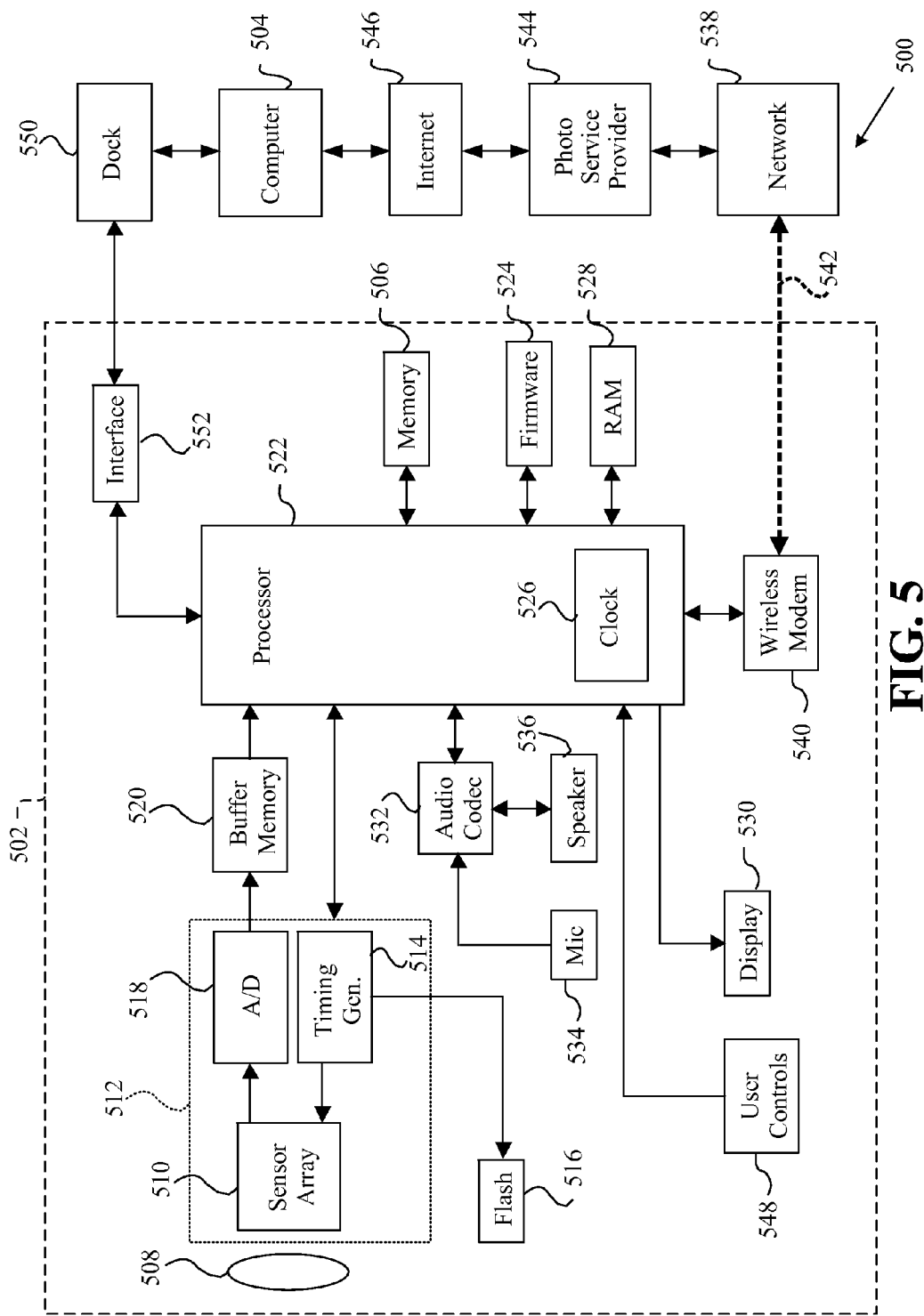
FIG. 5 is a block diagram of an imaging system that can employ an image sensor having two semiconductor wafers in an embodiment in accordance with the invention.

FIG. 5 is a block diagram of an imaging system that can employ an image sensor having two semiconductor wafers in an embodiment in accordance with the invention. Imaging system 500 includes digital camera phone 502 and computing device 504. Digital camera phone 502 is an example of an image capture device that can that can employ an image sensor having two semiconductor wafers. Other types of image capture devices can be used with the present invention, such as, for example, digital still cameras and digital video camcorders.

Digital camera phone 502 is a portable, handheld, battery-operated device in an embodiment in accordance with the invention. Digital camera phone 502 produces digital images that are stored in memory 506, which can be, for example, an internal Flash EPROM memory or a removable memory card. Other types of digital image storage media, such as magnetic hard drives, magnetic tape, or optical disks, can alternatively be used to implement memory 506.

Digital camera phone 502 uses lens 508 to focus light from a scene (not shown) onto image sensor array 510 of active pixel sensor 512. Image sensor array 510 provides color image information using the Bayer color filter pattern in an embodiment in accordance with the invention. Image sensor array 510 is controlled by timing generator 514, which also controls flash 516 in order to illuminate the scene when the ambient illumination is low.

The analog output signals output from the image sensor array 510 are amplified and converted to digital data by analog-to-digital (A/D) converter circuit 518. The digital data are stored in buffer memory 520 and subsequently processed by digital processor 522. Digital processor 522 is controlled by the firmware stored in firmware memory 524, which can be flash EPROM memory.

Digital processor 522 includes real-time clock 526, which keeps the date and time even when digital camera phone 502 and digital processor 522 are in a low power state. The processed digital image files are stored in memory 506. Memory 506 can also store other types of data, such as, for example, music files (e.g. MP3 files), ring tones, phone numbers, calendars, and to-do lists.

In one embodiment in accordance with the invention, digital camera phone 502 captures still images. Digital processor 522 performs color interpolation followed by color and tone correction, in order to produce rendered sRGB image data. The rendered sRGB image data are then compressed and stored as an image file in memory 506. By way of example only, the image data can be compressed pursuant to the JPEG format, which uses the known "Exif" image format. This format includes an Exif application segment that stores particular image metadata using various TIFF tags. Separate TIFF tags can be used, for example, to store the date and time the picture was captured, the lens f/number and other camera settings, and to store image captions.

Digital processor 522 produces different image sizes that are selected by the user in an embodiment in accordance with the invention. One such size is the low-resolution "thumbnail" size image. Generating thumbnail-size images is described in commonly assigned U.S. Pat. No. 5,164,831, entitled "Electronic Still Camera Providing Multi-Format Storage Of Full And Reduced Resolution Images" to Kuchta, et al. The thumbnail image is stored in RAM memory 528 and supplied to display 530, which can be, for example, an active matrix LCD or organic light emitting diode (OLED). Generating thumbnail size images allows the captured images to be reviewed quickly on color display 530.

In another embodiment in accordance with the invention, digital camera phone 502 also produces and stores video clips. A video clip is produced by summing multiple pixels of image sensor array 510 together (e.g. summing pixels of the same color within each 4 column×4 row area of the image sensor array 510) to create a lower resolution video image frame. The video image frames are read from image sensor array 510 at regular intervals, for example, using a 15 frame per second readout rate.

Audio codec 532 is connected to digital processor 520 and receives an audio signal from microphone (Mic) 534. Audio codec 532 also provides an audio signal to speaker 536. These components are used both for telephone conversations and to record and playback an audio track, along with a video sequence or still image.

Speaker 536 is also used to inform the user of an incoming phone call in an embodiment in accordance with the invention. This can be done using a standard ring tone stored in firmware memory 524, or by using a custom ring-tone downloaded from mobile phone network 538 and stored in memory 506. In addition, a vibration device (not shown) can be used to provide a silent (e.g. non-audible) notification of an incoming phone call.

Digital processor 522 is connected to wireless modem 540, which enables digital camera phone 502 to transmit and receive information via radio frequency (RF) channel 542. Wireless modem 540 communicates with mobile phone network 538 using another RF link (not shown), such as a 3GSM network. Mobile phone network 538 communicates with photo service provider 544, which stores digital images uploaded from digital camera phone 502. Other devices, including computing device 504, access these images via the Internet 546. Mobile phone network 538 also connects to a standard telephone network (not shown) in order to provide normal telephone service in an embodiment in accordance with the invention.

A graphical user interface (not shown) is displayed on display 530 and controlled by user controls 548. User controls 548 include dedicated push buttons (e.g. a telephone keypad) to dial a phone number, a control to set the mode (e.g. "phone" mode, "calendar" mode" "camera" mode), a joystick controller that includes 4-way control (up, down, left, right) and a push-button center "OK" or "select" switch, in embodiments in accordance with the invention.

Dock 550 recharges the batteries (not shown) in digital camera phone 502. Dock 550 connects digital camera phone 502 to computing device 504 via dock interface 552. Dock interface 552 is implemented as wired interface, such as a USB interface, in an embodiment in accordance with the invention. Alternatively, in other embodiments in accordance with the invention, dock interface 552 is implemented as a wireless interface, such as a Bluetooth or an IEEE 802.11b wireless interface. Dock interface 552 is used to download images from memory 506 to computing device 504. Dock interface 552 is also used to transfer calendar information from computing device 504 to memory 506 in digital camera phone 502.

PARTS LIST 100 pixel
102 photodetector
104 transfer gate
106SW charge-to-voltage conversion mechanism on sensor wafer
106CW charge-to-voltage conversion mechanism on circuit wafer
108 reset transistor
110 supply voltage $V_{DD}$
112 amplifier
114 row select transistor
116 output
118 dashed lines
120 inter-wafer connection
200 image sensor
202 pixel regions
204 row
206 column
300 pixel
302 photodetector
304 transfer mechanism
306 charge-to-voltage conversion mechanism
308 reset mechanism
310 supply voltage $V_{DD}$
312 amplifier
314 row select transistor
316 output
318 dashed lines
320 inter-wafer connector
400 image sensor
402 sensor wafer
404 support circuit wafer
406 pixel region
408 gate of reset transistor
410 drain of reset transistor
412 interconnect layer
414 CMOS device layer
416 gate of amplifier
418 drain of amplifier
420 color filter
422 color filter
424 microlenses
500 imaging system
502 camera phone
504 computing device
506 memory
508 lens
510 image sensor array
512 active pixel sensor
514 timing generator
516 flash
518 analog-to-digital converter
520 buffer memory
522 digital processor
524 firmware memory
526 clock
528 RAM memory
530 display
532 audio codec
534 microphone
536 speaker
538 mobile phone network
540 wireless modem
542 RF channel
544 photo service provider
546 internet
548 user controls
550 dock
552 dock interface The invention claimed:

1. An image sensor comprising:
   (a) a sensor wafer comprising:
      a first array of pixel regions with each pixel region including:
         a photodetector for collecting charge in response to incident light;
         a charge-to-voltage conversion mechanism;
         a transfer mechanism for transferring charge from the photodetector to the charge-to-voltage mechanism; and
         a reset mechanism for discharging the charge-to-voltage conversion mechanism;
   (b) a support circuit wafer connected to the sensor wafer and including:
      a second array of pixel regions having support circuitry for each pixel region in the first array, wherein each pixel region in the second array is associated with one or more pixel regions in the first array, and the support circuitry includes an amplifier; and
   (c) an inter-wafer connector between each charge-to-voltage conversion mechanism on the sensor wafer and a gate of the amplifier in a respective pixel region on the support circuit wafer for transferring charge from the charge-to-voltage conversion mechanism to the amplifier.

2. The image sensor of claim 1, wherein the charge-to-voltage conversion mechanism includes a floating diffusion.

3. The image sensor of claim 1, wherein the support circuit wafer includes an interconnect layer and a Complementary Metal Oxide Semiconductor device layer.

4. The image sensor of claim 3, wherein the Complementary Metal Oxide Semiconductor device layer includes the second array of pixel regions having support circuitry for each pixel region in the first array.

5. The image sensor of claim 1, wherein the reset mechanism includes a reset drain of a reset transistor.

6. An image capture device comprising:
   an image sensor including:
   (a) a sensor wafer comprising:
      a first array of pixel regions with each pixel region including:
         a photodetector for collecting charge in response to incident light;
         a charge-to-voltage conversion mechanism;
         a transfer mechanism for transferring charge from the photodetector to the charge-to-voltage mechanism; and
         a reset mechanism for discharging the charge-to-voltage conversion mechanism;
   (b) a support circuit wafer connected to the sensor wafer and including:
      a second array of pixel regions having support circuitry for each pixel region in the first array, wherein each pixel region in the second array is associated with one or more pixel regions in the first array, and the support circuitry includes an amplifier; and
   (c) an inter-wafer connector between each charge-to-voltage conversion mechanism on the sensor wafer and a gate of the amplifier in a respective pixel region on the support circuit wafer for transferring charge from the charge-to-voltage conversion mechanism to the amplifier.

7. The image capture device of claim 6, wherein the charge-to-voltage conversion mechanism includes a floating diffusion.

8. The image capture device of claim 6, wherein the support circuit wafer includes an interconnect layer and a Complementary Metal Oxide Semiconductor device layer.

9. The image capture of claim 8, wherein the Complementary Metal Oxide Semiconductor device layer includes the second array of pixel regions having support circuitry for each pixel region in the first array.

10. The image capture device of claim 6, wherein the reset mechanism includes a reset drain of a reset transistor.

\* \* \* \* \*